United States Patent [19]

Kakinuma et al.

[11] Patent Number: 5,538,821
[45] Date of Patent: Jul. 23, 1996

[54] RESIST INK COMPOSITION AND CURED ARTICLE PREPARED THEREFROM

[75] Inventors: Masahisa Kakinuma, Menuma-machi; Shigeru Komori, Konosu; Kazuhiro Yoshida, Ogawa-machi; Minoru Yokoshima, Toride; Tetsuo Ohkubo, Ube; Kazunori Sasahara, Shimonoseki, all of Japan

[73] Assignees: Nippon Kayaku Kabushiki Kaisha; Taiyo Ink Manufacturing Co., Ltd., both of Tokyo, Japan

[21] Appl. No.: 240,023

[22] Filed: May 9, 1994

[30] Foreign Application Priority Data

May 10, 1993 [JP] Japan ................................ 5-108549

[51] Int. Cl.$^6$ ........................................................ G03C 3/00
[52] U.S. Cl. .................. 430/18; 430/280.1; 430/284.1; 430/286.1; 430/287.1; 522/97; 522/98; 522/100
[58] Field of Search ................................. 430/280, 286, 430/287, 284, 18; 522/97, 98, 100

[56] References Cited

U.S. PATENT DOCUMENTS

| 4,734,480 | 3/1988 | Kotera et al. ........................ 528/49 |
| 4,918,150 | 4/1990 | Sakakibara et al. ................. 522/92 |
| 4,933,259 | 6/1990 | Chihara et al. ..................... 430/280 |
| 4,943,516 | 7/1990 | Kamayachi et al. ................ 430/280 |
| 4,948,700 | 8/1990 | Maeda et al. ....................... 430/280 |
| 5,009,982 | 4/1991 | Kamayachi et al. ................ 430/280 |
| 5,049,628 | 9/1991 | Nawata et al. ...................... 525/502 |
| 5,100,767 | 3/1992 | Yanagawa et al. .................. 430/280 |

FOREIGN PATENT DOCUMENTS

| 0306273 | 3/1989 | European Pat. Off. . |
| 0346486 | 12/1989 | European Pat. Off. . |
| 0539606 | 5/1993 | European Pat. Off. . |
| 2580828 | 10/1986 | France . |
| 60-208337 | 10/1985 | Japan . |
| 61-59447 | 3/1986 | Japan . |
| 5178950 | 7/1993 | Japan . |
| 6-49174 | 2/1994 | Japan . |
| 8907785 | 8/1989 | WIPO . |

*Primary Examiner*—George F. Lesmes
*Assistant Examiner*—Laura Weiner
*Attorney, Agent, or Firm*—Nields & Lemack

[57] ABSTRACT

The present invention relates to a resist ink composition characterized by comprising a specific unsaturated polycarboxylic acid resin (A) or a specific unsaturated polycarboxylic acid/urethane resin (A'), a photopolymerization initiator (B), a diluent (C), and a curing component (D) and a cured article prepared therefrom.

In the formation of a solder resist pattern via selective UV-exposure through a patterned film followed by development of the unexposed part, the composition of the present invention is excellent in developability even though at a small acid value (mg KOH/g) or over a prolonged drying time and shows a resistance of the exposed part against the developing solution. Further, a cured article prepared therefrom is excellent in electroless gold plating resistance and fully satisfactory in adhesion and soldering heat resistance.

9 Claims, No Drawings

RESIST INK COMPOSITION AND CURED ARTICLE PREPARED THEREFROM

FIELD OF THE INVENTION

This invention relates to a resist ink composition and a cured article prepared therefrom. This resist ink composition is usable in a solder resist for the production of a printed circuit board or an electroless plating resist and can be developed with a dilute aqueous alkali solution and the cured article prepared therefrom is excellent in adhesiveness, soldering heat resistance and electroless gold plating resistance.

BACKGROUND OF THE INVENTION

In recent years, there have been widely used ultraviolet-curing compositions in various fields for reasons of saving energy, saving resources, improving workability and elevating productivity. In the field of processing printed circuit boards, there occurs a shift of the conventional heat-curing ink compositions (for example, solder resist inks and marking inks) to ultraviolet-curing ones for the same reasons.

Screen printing has been widely applied to the formation of resist patterns on printed circuit boards. However, this screen printing method frequently suffers from bleeding, bleed-through or sagging in the printing step, which makes it unsuitable for the recent tendency toward high-density printed circuit boards and surface mounting of parts.

In order to solve these problems, there have been developed photoresists of dry film type and liquid photo solder resists. The photoresists of dry film type have some disadvantages such that they are liable to form bubbles in the step of thermocompression, precarious in heat resistance and adhesiveness and expensive. As the liquid photo solder resists, on the other hand, solder resist ink compositions comprising a partial reaction product obtained from a novolak epoxy resin and acrylic acid as the main component are disclosed in, for example, Japanese Patent Laid-Open No. 208337/1985 and No. 59447/1986. To develop these ink compositions, however, it is necessary to use an organic solvent such as 1,1,1-trichloroethane, trichloroethylene, toluene or cyclohexanone, which brings about some problems in working environment and economy. In order to solve these problems accompanying the use of organic solvents, there has been proposed solder resist ink compositions which can be developed with dilute aqueous alkali solutions. For example, U.S. Pat. No. 5,009,982 has disclosed a resist ink composition comprising a product of reaction between a reaction product obtained from a novolak epoxy resin and acrylic acid with a polybasic acid anhydride as the main component. In the case of this resist ink composition, however, it is necessary to adjust the acid value of the product of the reaction between a reaction product obtained from a novolak epoxy resin and acrylic acid with a polybasic acid to a relatively high level so as to smoothly effect the development with a dilute aqueous alkali solution, which brings about some problems in properties. It also suffers from some disadvantages in procedures such that the drying time should be shortened and that when the ink composition is applied on a substrate and allowed to stand for a long time after drying the solvent, the unexposed part cannot be developed with a dilute aqueous alkali solution. Furthermore, a cured article prepared therefrom has only an insufficient electroless gold plating resistance, which brings about another problem.

SUMMARY OF THE INVENTION

The present inventors have conducted extensive studies in order to solve the above-mentioned problems and consequently succeeded in providing a resist ink composition and a cured article prepared therefrom, wherein the resist ink composition is excellent in the developability with a dilute aqueous alkali solution even though a resin employed as the main component has a relatively low acid value (mg KOH/g) and capable of being developed even though the drying period is prolonged and the cured film thereof is excellent in adhesiveness, soldering heat resistance and electroless gold plating resistance.

Accordingly, the present invention relates to a resist ink composition comprising: (1) an unsaturated polycarboxylic acid resin (A) or an unsaturated polycarboxylic acid/urethane resin (A'); (2) a photopolymerization initiator (B); (3) a diluent (C); and (4) a curing component (D); and a cured article prepared therefrom.

More particularly, one of the present inventions relates to a resist ink composition comprising an unsaturated polycarboxylic acid resin (A), a Photopolymerization initiator (B), a diluent (C) and a curing component (D), wherein said unsaturated polycarboxylic acid resin (A) comprises a product of reaction between a reaction product (I) and a polybasic acid (d), said reaction product (I) being one formed by the reaction of the following three components (a), (b) and (c):

(a) an epoxy compound having at least two epoxy groups in its molecule, (b) a compound having at least two hydroxyl groups and a non-hydroxylic reactive group that reacts with an epoxy group in its molecule, and (c) an unsaturated monocarboxylic acid.

The other invention relates to a resist ink composition comprising an unsaturated polycarboxylic acid/urethane resin (A'), a photopolimerization initiator (B), a diluent (C) and a curing component (D), wherein said unsaturated polycarboxylic acid/urethane resin (A') comprises a product of reaction among a reaction product (I), a polybasic acid (d) and an unsaturated monoisocyanate (e), said reaction product (I) being one formed by the reaction of the following three components (a), (b) and (c):

(a) an epoxy compound having at least two epoxy groups in its molecule, (b) a compound having at least two hydroxyl groups and a non-hydroxylic reactive group that reacts with an epoxy group in its molecule, and (c) an unsaturated monocarboxylic acid.

The unsaturated polycarboxylic acid resin (A) to be used in the present invention can be obtained by reacting a reaction product (I), which is formed by the reaction of an epoxy compound (a) having at least two epoxy groups in its molecule, a compound (b) having at least two hydroxyl groups and a non-hydroxylic reactive group that reacts with an epoxy group in its molecule, and an unsaturated monocarboxylic acid (c), with a polybasic acid (d). As particular examples of the epoxy compound (a) having at least two epoxy groups in its molecule, novolak epoxy resins, bisphenol epoxy resins, trisphenolmethane epoxy resins, alicyclic epoxy resins, amino-containing epoxy resins, copolymerized epoxy resins and other epoxy resins having a specific structure may be cited.

The novolak epoxy resins are those which can be obtained by reacting a novolak, which is formed by reacting a phenol such as phenol, cresol, a halogenated phenol or an alkylphenol with formaldehyde in the presence of an acidic catalyst, with epichlorohydrin and/or methylepichlorohydrin. As examples of commercially available novolak epoxy resins, EOCN-103, EOCN-104S, EOCN-1020, EOCN-1027, EPPN-201 and BREN-S (mfd. by Nippon Kayaku K.K.), DEN-431 and DEN-439 (mfd. by Dow Chemical Co.) and N-730, N-770, N-865, N-665, N-673 and VH-4150 (mfd. by Dainippon Ink and Chemicals, Inc.) may be cited.

Examples of the bisphenol epoxy resins include those which are obtained by reacting bisphenol such as bisphenol A, bisphenol F, bisphenol S or tetrabromobisphenol A with epichlorohydrin and/or methylepichlorohydrin and those which are obtained by reacting a condensate of diglycidyl ether of bisphenol A with the above-mentioned bisphenol with epichlorohydrin and/or methylepichlorohydrin. As examples of commercially available bisphenol epoxy resins, Epikote 1004 and Epikote 1002 (mfd. by Yuka-Shell) and DER-330 and-DER-337 (mfd. by Dow Chemical Co.) may be cited.

The trisphenolmethane epoxy resins are those which are obtained by reacting, for example, trisphenolmethane or triscresolmethane with epichlorohydrin and/or methylepichlorohydrin. As examples of commercially available trisphenolmethane epoxy resins, EPPN-501 and EPPN-502 (mfd. by Nippon Kayaku K.K.) may be cited.

As examples of the alicyclic epoxy resins, Celloxide 2021 (mfd. by Daicel Chemical Industries, Ltd.) may be cited, while TETRAD-X and TETRAD-C (mfd. by Mitsubishi Gas Chemical Co., Inc.) may be cited as examples of the amino group-containing epoxy resins. As examples of the copolymerized epoxy resins, CP-50 M and CP-50 S (mfd. by Nippon Oil and Fats Co., Ltd.), which are a glycidyl methacrylate/styrene copolymer and a glycidyl methacrylate/styrene/methyl methacrylate copolymer, and a glycidyl methacrylate/cyclohexylmaleimide copolymer may be cited.

As examples of the other epoxy resins, tris(2,3-epoxypropyl) isocyanurate, biphenyl diglycidyl ether, Epomic VG-3101 (mfd. by Mitsui Petrochemical Industries, Ltd.), E-1031S (mfd. by Yuka-Shell Epoxy) and EPB-13 and EPB-27 (mfd. by Nippon Soda Co., Ltd.) may be cited. As particularly preferable examples of the epoxy compound, cresol novolak epoxy resins and phenol novolak epoxy resins may be cited.

As particular examples of the compound (b) having at least two hydroxyl groups and a non-hydroxylic reactive group (for example, a carboxylate group or a secondary amino group) that reacts with an epoxy group in its molecule, ($C_1$ to $C_8$) monocarboxylic acids having two or more hydroxyl groups such as dimethylolpropionic acid, dimethylolacetic acid, dimethylolbutyric acid, dimethylolvaleric acid and dimethylolcaproic acid, and dialkanolamines ($C_1$-$C_5$) such as diethanolamine and diisopropanolamine may be cited. As a particularly preferable example thereof, dimethylolpropionic acid may be cited.

As particular example of the unsaturated monocarboxylic acid (c), acrylic acid and acrylic acid derivatives may be cited. Examples of the acrylic acid derivatives include acrylic acid dimer, methacrylic acid, β-styrylacrylic acid, β-furfurylacrylic acid, crotonic acid, α-cyanocinnamic acid, cinnamic acid, a half ester of a saturated and/or unsaturated dibasic acid anhydride with (meth)acrylate having one hydroxyl group in its molecule, and a half ester which is a product obtained from a reaction between a saturated and/or unsaturated dibasic acid and an unsaturated monoglycidyl compound, for example, half esters obtained by reacting a saturated or unsaturated dibasic acid anhydride such as succinic anhydride, maleic anhydride, phthalic anhydride, tetrahydrophthalic anhydride, hexahydrophthalic anhydride, methylhexahydrophthalic anhydride, methyltetrahydrophthalic anhydride, itaconic anhydride or methy-endo-methylenetetrahydrophthalic anhydride with an equimolar amount of a (meth)acrylate having one hydroxyl group in its molecule such as hydroxyethyl (meth)acrylate, hydroxypropyl (meth)acrylate, hydroxybutyl (meth)acrylate, polyethylene glycol mono(meth)acrylate, glycerol di(meth)acrylate, trimethylolpropane di(meth)acrylate, pentaerythritol tri(meth)acrylate, dipentaerythritol penta(meth)acrylate or phenyl glycidyl ether (meth)acrylate, and half esters obtained by reacting a saturated or unsaturated dibasic acid (for example, succinic acid, maleic acid, adipic acid, phthalic acid, tetrahydrophthalic acid, hexahydrophthalic acid, itaconic acid or fumaric acid) with an equimolar amount of an unsaturated monoglycidyl compound [for example, glycidyl (meth)acrylate,

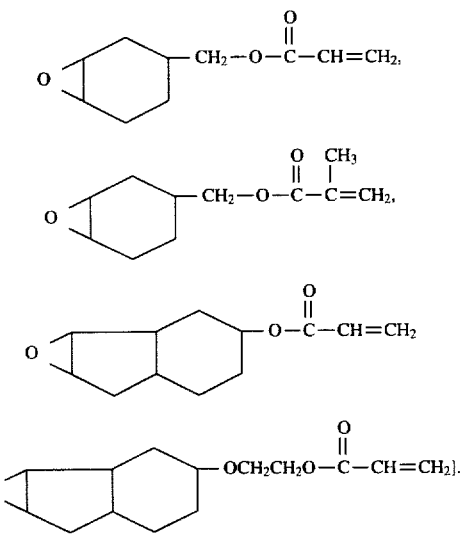

These materials may be used either alone or as a mixture thereof. As a particularly preferable example thereof, acrylic acid may be cited.

The reaction among the above-mentioned epoxy compound (a), the above-mentioned compound (b) and the above-mentioned unsaturated monocarboxylic acid (c) can be carried out by the following two methods including: (1) reacting the epoxy compound (a) with the compound (b) [or the unsaturated monocarboxylic acid (c)] and then reacting the resulting product with the unsaturated monocarboxylic acid (c) [or the compound (b)]; and (2) reacting the epoxy compound (a), the compound (b) and the unsaturated monocarboxylic acid (c) at once. Although both methods are usable in the present invention, the latter one is preferable to the former. In the reaction of the epoxy compound (a), the compound (b) and the unsaturated monocarboxylic acid (c), the compound (b) and the unsaturated monocarboxylic acid (c) are preferably used in a total amount of from about 0.8 to 1.3 mol, still preferably from about 0.9 to 1.1 mol, per equivalent of the epoxy group in the epoxy compound (a). Regarding the amounts of the compound (b) and the unsaturated monocarboxylic acid (c) to be used in this reaction, the compound (b) is used preferably at a ratio of from 0.05 to 0.5 mol, still preferably from 0.1 to 0.3 mol, per mol of the total amount of the compound (b) with the unsaturated nonocarboxylic acid (c).

In this reaction, it is desirable to use a diluent selected from among organic solvents, for example, ketones such as ethyl methyl ketone and cyclohexanone, aromatic hydrocarbons such as toluene, xylene and tetramethylbenzene, glycol ethers such as dipropylene glycol dimethyl ether and dipropylene glycol diethyl ether, esters such as ethyl acetate, butyl acetate, butylcellosolve acetate and carbitol acetate, aliphatic hydrocarbons such as octane and decane, and petroleum solvents such as petroleum ether, petroleum naphtha, hydrogenated petroleum naphtha and solvent naphtha, and reactive monomers such as carbitol (meth)acrylate, phenoxyethyl (meth)acrylate, pentaerythritol tetra(meth)acrylate, pentaerythritol tetra(meth)acrylate, trimethylolpropane tri(meth)acrylate, tris(hydroxyethyl) isocyanurate tri(meth)acrylate and dipentaerythritol hexa(meth)acrylate. Further, it is preferable to use a catalyst (for example, triethylamine, benzyldimethylamine, methyltriethylammonium chloride, benzyltrimethylammonium bromide, benzyltrimethylammonium iodide, triphenylphosphine, triphenylstibine, chromium octanoate or zirconium octanoate) to thereby accelerate the reaction. This catalyst may be used preferably in an amount of from 0.1 to 10% by weight based on the feedstock reaction mixture. In order to inhibit polymerization during the reaction, it is preferable to use a polymerization inhibitor (for example, hydroquinone, methylhydroquinone, hydroquinone monomethyl ether, catechol or pyrogallol). This polymerization inhibitor may be used preferably in an amount of 0.01 to 1% by weight based on the feedstock reaction mixture. The reaction temperature preferably ranges from 60° to 150° C. The reaction period preferably ranges from 5 to 60 hours. Thus the reaction product (I) can be obtained.

Next, this reaction product (I) is reacted with a polybasic acid (d) (for example, anhydride of a carboxylic acid having 2 to 4 carboxyl groups in its molecule such as maleic anhydride, succinic anhydride, phthalic anhydride, tetrahydrophthalic anhydride, hexahydrophthalic anhydride, methylhexahydrophthalic anhydride, methyl-endo-methylenetetrahydrophthalic anhydride, anhydrotrimellitic acid or pyromellitic anhydride, preferable examples thereof being tetrahydrophthalic anhydride and succinic anhydride) by using 0.1 to 0.9 equivalent of the above-mentioned polybasic acid per equivalent of the hydroxyl group in the above-mentioned reaction product (I). The reaction temperature preferably ranges from 60° to 150° C. The reaction period preferably ranges from 1 to 10 hours.

The unsaturated polycarboxylic acid/urethane resin (A') to be used in the present invention can be obtained by reacting the above-mentioned reaction product (I) with the above-mentioned polybasic acid (d) and an unsaturated monoisocyanate (e).

Particular examples of the unsaturated monoisocyanate (e) include

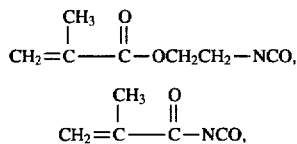

and products obtained by reacting organic diisocyanates (for example, tolylene diisocyanate, xylylene diisocyanate, isophorone diisocyanate and hexamethylene diisocyanate) with an equimolar amount of (meth)acrylates having a hydroxyl group in its molecule as described above. The reaction among the above-mentioned reaction product (I), the above-mentioned polybasic acid (d) and the above-mentioned unsaturated monoisocyanate (e) can be preferably effected by first reacting the reaction product (I) with the polybasic acid (d) and then reacting the obtained product with the unsaturated monoisocyanate (e). The reaction product (I) and the polybasic acid (d) can be reacted in the above-mentioned manner. Subsequently, the above-mentioned unsaturated monoisocyanate is reacted preferably in an amount of 0.05 to 0.5 equivalent per equivalent of the hydroxyl group in the above-mentioned unsaturated polycarboxylic acid resin (A) which is a product obtained by reacting the above-mentioned reaction product (I) with the polybasic acid (d). The reaction temperature preferably ranges from 60° to 100° C. It is preferable to add a small amount of a catalyst (for example, dibutyltin laurate) in this reaction. The reaction time preferably range from 5 to 15 hours.

The acid value (mg KOH/g) of the unsaturated polycarboxylic acid resin (A) or unsaturated polycarboxylic acid/urethane resin (A') thus obtained preferably ranges from 30 to 100, still preferably from 40 to 80.

The content of the unsaturated polycarboxylic acid resin (A) or the unsaturated polycarboxylic acid/urethane resin (A') in the composition of the present invention preferably ranges from 10 to 80% by weight, still preferably 15 to 60% by weight.

Particular examples of the photopolymerization initiator (B) include benzoins such as benzoin, benzoin methyl ether and benzoin isopropyl ether, acetophenones such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl-1-[4-(methylthio)phenyl]-2-morpholinopropane-1-one and N,N-dimethylaminoacetophenone, anthraquinones such as 2-methylanthraquinone, 2-ethylanthraquinone, 2-tertbutylanthraquinone, 1-chloroanthraquinone, 2-amylanthraquinone and 2-aminoanthraquinone, thioxanthones such as 2,4-dimethylthioxanthone, 2,4-diethylthioxanthone, 2-chlorothioxanthone and 2,4-diisopropylthioxanthone, ketals such as acetophenone dimethyl ketal and benzil dimethyl ketal, benzophenones such as benzophenone, methylbenzophenone, 4,4'-dichlorobenzophenone, 4,4'-bisdiethylaminobenzophenone, Michler's ketone and 4-benzoyl-4'-methyldiphenyl sulfide and 2,4,6-trimethylbenzoyldiphenylphosphine oxide. These compounds may be used either alone or in a combination thereof. As examples of the preferable combination thereof, those comprising 2-methyl-1-[4-(methylthio)phenyl]-2-morpholinopropane-1-one (Irgacure 907, mfd. by Ciba-Geigy) with 2,4-diethylthioxanthone (Kayacure DETX, mfd. by Nippon Kayaku K.K.), 2-isopropylthioxanthone or 4-benzoyl-4'-methyldiphenyl sulfide may be cited.

To such a photopolymerization initiator (B), one or more photosensitizers, for example, ethyl N,N-dimethylaminobenzoate, isoamyl N,N-dimethylaminobenzoate, pentyl 4-dimethylaminobenzoate and tertiary amines such as triethylamine and triethanolamine may be added.

The photopolymerization initiator (B) is used preferably at a ratio of from 0.5 to 20% by weight, still preferably from 1 to 10% by weight, in the composition of the present invention.

As the diluent (C), organic solvents and/or photopolymerizable monomers can be used. Typical examples of the organic solvents include ketones such as ethyl methyl ketone and cyclohexanone, aromatic hydrocarbons such as toluene, xylene and tetramethylbenzene, glycol ethers such as methyl cellosolve, butyl cellosolve, methyl carbitol, butyl carbitol, propylene glycol monomethyl ether, dipropylene glycol monoethyl ether, dipropylene glycol diethyl ether and triethylene glycol monoethyl ether, esters such as ethyl acetate, butyl acetate, butyl cellosolve acetate and carbitol acetate, alcohols such as ethanol, propanol, ethylene glycol and propylene glycol, aliphatic hydrocarbons such as octane and decane and petroleum solvents such as petroleum ether, petroleum naphtha, hydrogenated petroleum naphtha and solvent naphtha.

Typical examples of the photopolymerizable monomers include hydroxyalkyl (meth)acrylates such as 2-hydroxyethyl (meth)acrylate and 2-hydroxypropyl (meth)acrylate, mono- or di(meth)acrylates of glycols such as ethylene glycol, methoxytetraethylene glycol and polyethylene glycol, (meth)acrylamides such as N,N-dimethyl(meth)acrylamide and N-methylol(meth)acrylamide, aminoalkyl (meth)acrylates such as N,N-dimethylaminoethyl (meth)acrylate, polyhydric alcohols such as hexanediol, trimethylolpropane, pentaerythritol, ditrimethylolpropane, dipentaerythritol and trishydroxyethyl isocyanurate or polyhydric (meth)acrylates of ethylene oxide or propylene oxide adducts thereof, (meth)acrylates of ethylene oxide or propylene oxide adducts of phenols such as phenoxyethyl (meth)acrylate and bisphenol A, (meth)acrylates of glycidyl ethers such as glycerol diglycidyl ether, trimethylolpropane triglycidyl ether and triglycidyl isocyanurate and melamine (meth)acrylate.

These diluents (C) may be used either alone or in the form of a mixture thereof. The content of the diluent (C) in the composition of the present invention preferably ranges from 5 to 80% by weight, still preferably 10 to 70% by weight.

The above-mentioned diluent (C) is employed in order to dilute the component (A) or (A') to thereby facilitate the application and enhance photopolymerization properties (in the case where it is a photopolymerizable monomer), or to dissolve and dilute the component (A) or (A') to thereby form a film through application in the form of a liquid followed by drying (in the case where it is an organic solvent). Therefore, either the contact exposure system wherein the coating film is in contact with a photomask or The non-contact exposure system may be employed depending on the selected diluent.

As examples of the curing component (D), those which are free from any unsaturated double bond and can be cured per se when exposed to heat or UV light and those which can be cured Through the reaction with hydroxyl or carboxyl groups contained in the component (A) or (A'), i.e., the main component of the composition of the present invention may be cited. Particular examples thereof include epoxy compounds having one or more epoxy groups in its molecule [for example, bisphenol A epoxy resins (for example, Epikote 1009 and 1031, mfd. by Yuka-Shell; Epiclon N-3050 and N-7050, mfd. by Dainippon Ink and Chemicals, Inc.; DER-642U and DER-673MF, mfd. by Dow Chemical Co.), hydrogenated bisphenol A epoxy resins (for example, ST-2004 and ST-2007, mfd. by Toto Kasei K.K.), bisphenol F epoxy resins (for example, YDF-2004 and YDF-2007, mfd. by Toto Kasei K.K.), brominated bisphenol A epoxy resins (for example, SR-BBS and SR-TBA-400, mfd. by Sakamoto Yakuhin Kogyo K.K.; YDB-600 and YDB-715, mfd. by Toro Kasei K.K.), novolak epoxy resins (for example, EPPN-201, EOCN-103, EOCN-1020 and BREN, mfd. by Nippon Kayaku K.K.)., novolak type epoxy resins of bisphenol A (for example, Epiclon-880, mfd. by Dainippon Ink and Chemicals, Inc.), amino group-containing epoxy resins (for example, YL-931 and YL-933, mfd. by Yuka-Shell), rubber-modified epoxy resins (for example, Epiclon TSR-601, mfd. by Dainippon Ink and Chemicals, Inc.), bispheiol S epoxy resins (for example, EBPS-200, mfd. by Nippon Kayaku K.K.; Epiclon EXA-1514, mfd. by Dainippon Ink and Chemicals, Inc.), diglycidyl terephthalate (for example, Blemmer DGT, mfd. by Nippon Oil and Fats Co., Ltd.), triglycidyl isocyanurate (for exmaple, TEPIC mfd. by Nissan Chemical Industries, Ltd.), bixylenol epoxy resins (for example, YX-4000, mfd. by Yuka-Shell), biphenol epoxy resins (for example, YL-6056, mfd. by Yuka-Shell) and alicyclic epoxy resins (for example, Celloxide 2021, mfd. by Daicel Chemical Industries, Ltd.)], melamine derivatives (for example, hexamethoxymelamine, hexabutoxymelamine and condensed hexamethoxymelamine), urea compounds (for example, dimethylolurea), bisphenol A-based compounds (for example, tetramethylolbisphenol A) and oxazolidine compounds.

This curing compound (D) is employed in order to improve various properties including adhesiveness, heat resistance and plating resistance of the composition as a solder resist.

The above-mentioned curing components (D) may be used either alone or in the form of a mixture thereof. The content of the curing component (D) in the composition of the present invention preferably ranges from 1 to 50% by weight, still preferably from 3 to 45% by weight.

When an epoxy compound is selected from among the curing components (D) as described above, it is preferable to use a curing agent for epoxy resins together therewith so as to further improve the properties of the resulting composition, such as adhesiveness, chemical resistance and heat resistance. Examples of such a curing agent for epoxy resins include well known and widely used curing agents and curing promoters, e.g., imidazole derivatives such as 2MZ, 2E4MZ, $C_{11}Z$, $C_{17}TZ$, 2PZ, IB2MZ, 2MZ-CN, 2E4MZ-CN, $C_{11}Z$-CN, 2PZ-CN, 2PHZ-CN, 2MZ-CNS, 2E4MZ-CNS, 2PZ-CNS, 2MZ-AZINE, 2E4MZ-AZINE, $C_{11}Z$-AZINE, 2MA-OK, 2P4MHZ, 2PHZ and 2P4BHZ (mfd. by Shikoku Chemicals Corporation); guanamines such as acetoguanamine and benzoguanamine; polyamines such as diaminodiphenylmethane, m-phenylenediamine, m-xylenediamine, diaminodiphenyl sulfone, dicyandiamide, urea, urea derivatives, melamine and polybasic hydrazide; organic acid salts and/or epoxy adducts thereof; amine complex of boron trifluoride: triazine derivatives such as ethyldiamino-s-triazine, 2,4-diamino-s-triazine and 2,4-diamino-6-xylyl-s-triazine; tertiary amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol), tetramethylguanidine and m-aminophenol; polyphenols such as polyvinylphenol, brominated polyvinylphenol, phenol novolak and alkylphenol novolak; organic phosphines such as tributylphosphine, triphenylphosphine and tris-2-cyanoethylphosphine; phosphonium salts such as tri-n-butyl(2,5-dihydroxyphenyl)phosphonium bromide and hexadecyltributylphosphonium chloride; quaternary ammonium salts such as benzyltrimethylammonium chloride and phenyltributylammonium chloride; the above mentioned polybasic acid anhydride; cationic photopolymerization catalysts such as diphenyliodonium tetrafluoroborate, triphenylsulfonium hexafluoroantimonate, 2,4,6-triphenylthiopyrylium hexafluorophosphate, Irgacure 261 (mfd. by Ciba-Geigy) and Optomer SP-170 (mfd. by Asahi Denka Kogyo K.K.); styrene/maleic anhydride resins; equimolar reaction products obtained by reacting, for example, phenyl isocyanate with dimethylamine and equimolar reaction products obtained by reacting, for example, an organic polyisocyanate such as tolylene diisocyanate or isophorone diisocyanate with dimethylamine. These compounds may be used either alone or in the form of a mixture thereof. The epoxy resin curing agent is used preferably at a ratio of from 0.01 to 25 parts by weight, still preferably from 0.1 to 15 parts by weight, per 100 parts by weight of the above-mentioned epoxy compound.

To improve its properties including adhesion and hardness, the composition of the present invention may further contain well known and widely used inorganic fillers such as barium sulfate, barium titanate, a silicon oxide powder, a fine silicon oxide powder, amorphous silica, talc, clay, magnesium carbonate, calcium carbonate, aluminum oxide, aluminum hydroxide and a mica powder, if necessary. Such an inorganic filler is used in the composition of the present invention preferably at a ratio of from 0 to 60% by weight, still preferably from 5 to 40% by weight.

Furthermore, the composition of the present invention may contain well known and widely used additives, for example, well known and widely used coloring pigments such as phthalocyanine blue, phthalocyanine green, iodine green, disazo yellow, crystal violet, titanium oxide, carbon black and naphthalene black, well known and widely used polymerization inhibitors such as hydroquinone, hydroquinone monomethyl ether, tert-butylcatechol, pyrogallol and phenothiazine, well known and widely used thicking agents such as asbestos, organophilic bentonite, bentonite and montmorillonite, silicone-based, fluorine-based or polymeric defoaming agents and/or leveling agents and adhesiveness-imparting agents such as imidazole-based, thiazole-based, triazole-based and silane coupling agents, if necessary.

Furthermore, publicly known binder resins, for example, copolymers of ethylenically unsaturated compounds such as acrylates and polyester resins synthesized from polyhydric alcohols and polybasic acid compounds, and photopolymerizable oligomers such as polyester (meth)acrylate, polyurethane (meth)acrylate and epoxy (meth)acrylate may be used in the composition of the present invention, so long as its properties as a solder resist are not deteriorated thereby.

Furthermore, water may be added to the composition of the present invention so as to suppress its flammability. When water is to be added, the component (A) or (A') can be solubilized in the water by converting the carboxyl group in the component (A) or (A') into a salt group with the use of an amine such as trimethylamine or triethylamine or a (meth)acrylate compound having a tertiary amino group such as N,N-dimethylaminoethyl (meth)acrylate, N,N-dimethylaminopropyl (meth)acrylate, N,N-dimethyl(meth)acrylamide, acryloylmorpholine, N-isopropyl(meth)acrylamide or N-methylolacrylamide.

The composition of the present invention can be obtained by blending these components preferably at the ratio as specified above and then homogeneously mixing by using, for example, a roll mill.

The resist ink composition according to the present invention can be cured in, for example, the following manner to thereby give a cured article. Namely, the composition of the present invention is applied onto a printed circuit board by, for example, the screen printing method, the spraying method, the roll coating method or the curtain coating method to give a film thickness of 10 to 160 μm. Then the coating film is dried at a temperature of 60° to 110° C. and a negative film is brought into direct contact with the coating film (or placed on the coating film without being in contact therewith). Next, it is irradiated with UV light and the unexposed part is dissolved in a dilute aqueous alkali solution (for example, a 0.5 to 2% aqueous solution of sodium carbonate) and eliminated (i.e. developed). To improve various properties, curing is sufficiently effected by UV irradiation and/or heating (for example, at 100° to 200° C. for 0.5 to 1.0 hour) and thus a cured coating film is obtained.

[EXAMPLES]

To further illustrate the present invention in greater detail, the following Examples will be given wherein all parts are by weight.

[Example of the synthesis of unsaturated polycarboxylic acid resin (A)]

Synthesis Example 1

2200 parts (10 equivalents) of a cresol novolak resin (EOCN-1043, mfd. by Nippon Kayaku K.K., softening point: 92° C., epoxy equivalent: 220), 134 parts (1 mol) of dimethylolpropionic acid, 648.5 parts (9 mol) of acrylic acid, 4.6 parts of methylhydroquinone, 1131 parts of carbitol acetate and 484.9 parts of solvent naphtha were fed into a reactor and heated to 90° C. under stirring to thereby dissolve the reaction mixture. Then the reaction mixture was cooled to 60° C. and 13.8 parts of triphenylphosphine was added thereto. After heating at 100° C., and reacting for about 32 hours, a reaction product (hydroxyl group: 12 equivalents) having an acid value of 0.5 mg KOH/g was obtained. To this reaction product were added 364.7 parts (2.4 mol) of tetrahydrophthalic anhydride, 137.5 parts of carbitol acetate and 58.8 parts of solvent naphtha. The obtained mixture was heated to 95° C., reacted for about 6 hours and cooled. Thus an unsaturated polycarboxylic acid resin (A-10-1) having an acid value of the solid component of 40 mg KOH/g and a solid concentration of 65% was obtained.

Synthesis Examples 2 to 4

The reaction of the Synthesis Example 1 was repeated except that the amounts of the three feedstocks to be used in the reaction of the tetrahydrophthalic anhydride, i.e., the tetrahydrophthalic anhydride, carbitol acetate and solvent naphtha were varied. Thus unsaturated polycarboxylic acid resins having a solid concentration of 65% as listed in Table 1 were obtained.

TABLE 1

| Synthesis Example | 2 | 3 | 4 |
|---|---|---|---|
| carbitol acetate feed | 177.2 | 219.5 | 264.7 |
| solvent naphtha feed | 76.0 | 94.2 | 113.5 |
| tetrahydrophthalic anhydride feed | 470.2 | 582.5 | 702.3 |
| unsaturated polycarboxylic acid resin | A-10-2 | A-10-3 | A-10-4 |
| acid value of solid component (mg KOH/g) | 50 | 60 | 70 |

Synthesis Example 5

2050 parts (10 equivalents) of a cresol novolak resin (EOCN-1020, mfd. by Nippon Kayaku K.K., softening point: 92° C., epoxy equivalent: 205), 268 parts (2 mol) of dimethylolpropionic acid, 576.5 parts (8 mol) of acrylic acid, 4.4 parts of methylhydroquinone, 1098 parts of carbitol acetate and 470.1 parts of solvent naphtha were fed into a reactor and heated to 90° C. under stirring to thereby dissolve the reaction mixture. Then the reaction mixture was cooled to 60° C. and 13.3 parts of triphenylphosphine was added thereto. After heating at 100° C. and reacting for about 32 hours, a reaction product (hydroxyl group: 14 equivalents) having an acid value of 0.9 mg KOH/g was obtained. To this reaction product were added 257.6 parts (1.69 mol) of tetrahydrophthalic anhydride, 97 parts of carbitol acetate and 41.6 parts of solvent naphtha. The obtained mixture was heated to 95° C., reacted for about 6 hours and cooled. Thus an unsaturated polycarboxylic acid resin (A-20-1) having an acid value of the solid component of 30 mg KOH/g and a solid concentration of 65% was obtained.

Synthesis Examples 6 to 9

The reaction of the Synthesis Example 5 was repeated except that the amounts of the three feedstocks to be used in the reaction of the tetrahydrophthalic anhydride, i.e., the tetrahydrophthalic anhydride, carbitol acetate and solvent naphtha were varied. Thus unsaturated polycarboxylic acid resins having a solid concentration of 65% as listed in Table were obtained.

TABLE 2

| Synthesis Example | 6 | 7 | 8 | 9 |
|---|---|---|---|---|
| carbitol acetate feed | 133.4 | 172 | 217 | 256.9 |
| solvent naphtha feed | 57.2 | 73.7 | 93.5 | 110.1 |
| tetrahydrophthalic anhydride feed | 354 | 456.3 | 576.6 | 681.6 |
| unsaturated polycarboxylic acid resin | A-20-2 | A-20-3 | A-20-4 | A-20-5 |
| acid value of solid component (mg KOH/g) | 40 | 50 | 61 | 70 |

Synthesis Example 10

2200 parts (10 equivalents) of a cresol novolak resin (EOCN-104S, mfd. by Nippon Kayaku K.K., softening point: 92° C., epoxy equivalent: 220), 402 parts (3 mol) of dimethylolpropionic acid, 504.4 parts (7 mol) of acrylic acid, 4.8 parts of methylhydroquinone, 1178 parts of carbitol acetate and 505 parts of solvent naphtha were fed into a reactor and heated to 90° C. under stirring to thereby dissolve the reaction mixture. Then the reaction mixture was cooled to 60° C. and 14.3 parts of triphenylphosphine was added thereto. After heating at 100° C. and reacting for about 32 hours, a reaction product (hydroxyl group: 16 equivalents) having an acid value of 0.8 mg KOH/g was obtained. To this reaction product were added 276.5 parts (1.82 mol) of tetrahydrophthalic anhydride, 104 parts of carbitol acetate and 45 parts of solvent naphtia. The obtained mixture was heated to 95° C., reacted for about 6 hours and cooled. Thus an unsaturated polycarboxylic acid resin (A-30-1) having an acid value of the solid component of 30 mg KOH/g and a solid concentration of 65% was obtained.

Synthesis Examples 11 to 14

The reaction of the Synthesis Example 10 was repeated except that the amounts of the three feedstocks to be used in the reaction of the tetrahydrophthalic anhydride, i.e., the tetrahydrophthalic anhydride, carbitol acetate and solvent naphtha were varied. Thus unsaturated polycarboxylic acid resins having a solid concentration of 65% as listed in Table 3 were obtained.

TABLE 3

| Synthesis Example | 11 | 12 | 13 | 14 |
|---|---|---|---|---|
| carbitol acetate feed | 143.2 | 184.6 | 228.7 | 275.2 |

TABLE 3-continued

| Synthesis Example | 11 | 12 | 13 | 14 |
|---|---|---|---|---|
| solvent naphtha feed | 61.4 | 79.1 | 98 | 118.2 |
| tetrahydrophthalic anhydride feed | 379.2 | 489.7 | 606.7 | 731.5 |
| unsaturated polycarboxylic acid resin | A-30-2 | A-30-3 | A-30-4 | A-30-5 |
| acid value of solid component (mg KOH/g) | 40 | 50 | 60 | 70 |

Synthesis Example 15

2200 parts (10 equivalents) of a cresol novolak resin (EOCN-104S, mfd. by Nippon Kayaku K.K., softening point: 92° C., epoxy equivalent: 220), 268 parts (2 mol) of dimethylolpropionic acid, 576.5 parts (8 mol) of acrylic acid, 4.7 parts of methylhydroquinone, 1155 parts of carbitol acetate and 494.4 parts of solvent naphtha were fed into a reactor and heated to 90° C. under stirring to thereby dissolve the reaction mixture. Then the reaction mixture was cooled to 60° C. and 14.0 parts of triphenylphosphine was added thereto. After heating at 100° C. and reacting for about 32 hours, a reaction product (hydroxyl group: 14 equivalents) having an acid value of 1.0 mg KOH/g was obtained. To this reaction product were added 173 parts (1.73 mol) of succinic anhydride, 65.2 parts of carbitol acetate and 27.8 parts of solvent naphtha. The obtained mixture was heated to 95° C., reacted for about 6 hour and cooled. Thus an unsaturated polycarboxylic acid resin (A-20-1S) having an acid value of the solid component of 30 mg KOH/g and a solid concentration of 65% was obtained.

Synthesis Examples 16 to 19

The reaction of the Synthesis Example 15 was repeated except that the amounts of the three feedstocks to be used in the reaction of the succinic anhydride, i.e., the succinic anhydride, carbitol acetate and solvent naphtha were varied. Thus unsaturated polycarboxylic acid resins having a solid concentration of 65% as listed in Table 4 were obtained.

TABLE 4

| Synthsis Example | 16 | 17 | 18 | 19 |
|---|---|---|---|---|
| carbitol acetate feed | 88.6 | 113 | 151.3 | 164.6 |
| solvent naphtha feed | 38.0 | 48.4 | 64.8 | 70.5 |
| succinic anhydirde feed | 235.1 | 299.7 | 401.3 | 436.6 |
| unsaturated polycarboxylic acid resin | A-20-2S | A-20-3S | A-20-4S | A-20-5S |
| acid value of solid component (mg KOH/g) | 40 | 50 | 65 | 70 |

[Example of the synthesis of unsaturated polycarboxylic acid resin free from the component (b) (resins of Comparative Examples 1 to 6)]

Synthesis Example 20

2200 parts (10 equivalents) of a cresol novolak resin (EOCN-104S, mfd. by Nippon Kayaku K.K., softening point: 92° C., epoxy equivalent: 220), 720 parts (10 mol) of acrylic acid, 4.5 parts of methylhydroquinone, 1107 parts of carbitol acetate and 475 parts of solvent naphtha were fed into a reactor and heated to 90° C. under stirring to thereby dissolve the reaction mixture. Then the reaction mixture was cooled to 60° C. and 13.5 parts of triphenylphosphine was added thereto. After heating at 100° C. and reacting for about 32 hours, a reaction product (hydroxyl group: 10 equivalents) having an acid value of 1.1 mg KOH/g was obtained. To this reaction product were added 357 parts (2.35 mol) of tetrahydrophthalic anhydride, 135 parts of carbitol acetate and 57.2 parts of solvent naphtha. The obtained mixture was heated to 95° C., reacted for about 6 hours and cooled. Thus an unsaturated polycarboxylic acid resin (A-0-1) having an acid value of the solid component of 40 mg KOH/g and a solid concentration of 65% was obtained.

Synthesis Examples 21 to 25

The reaction of the Synthesis Example 20 was repeated except that the amounts of the three feedstocks to be used in the reaction of the tetrahydrophthalic anhydride, i.e., the tetrahydrophthalic anhydride, carbitol acetate and solvent naphtha were varied. Thus unsaturated polycarboxylic acid resins having a solid concentration of 65% as listed in Table 5 were obtained.

TABLE 5

| Synthesis Example | 21 | 22 | 23 | 24 | 25 |
|---|---|---|---|---|---|
| carbitol acetate feed | 173.5 | 215 | 259.1 | 306.5 | 357.1 |
| solvent naphtha feed | 74.4 | 92.1 | 111.1 | 131.3 | 153 |
| tetrahydrophthalic anhydride feed | 460.4 | 570.3 | 687.6 | 813.0 | 947.4 |
| unsaturated polycarboxylic acid resin | A-0-2 | A-0-3 | A-0-4 | A-0-5 | A-0-6 |
| acid value of solid component (mg KOH/g) | 50 | 60 | 70 | 80 | 90 |

[Example of the synthesis of unsaturated polycarboxylic acid/urethane resin (A')]

Synthesis Example 26

2200 parts (10 equivalents) of a cresol novolak resin (EOCN-104S, mfd. by Nippon Kayaku K.K., softening point: 92° C., epoxy equivalent: 220), 402 parts (3 mol) of dimethylolpropionic acid, 504.4 parts (7 mol) of acrylic acid, 4.8 parts of methylhydroquinone, 1178 parts of carbitol acetate and 505 parts of solvent naphtha were fed into a reactor and heated to 90° C. under stirring to thereby dissolve the reaction mixture. Then the reaction mixture was cooled to 60° C. and 14.3 parts of triphenylphosphine was added thereto. After heating at 100° C. and reacting for about 32 hours, a reaction product (hydroxyl group: 16 equivalents) having an acid value of 0.8 mg KOH/g was obtained. To this reaction product were added 402.5 parts (2.65 mol) of tetrahydrophthalic anhydride, 133 parts of carbitol acetate and 57.3 parts of solvent naphtha. The obtained mixture was heated to 95° C., reacted for about 6 hours and cooled. Thus an unsaturated polycarboxylic acid resin (hydroxyl group: 13.35 equivalents) having an acid value of the solid component of 31.6 mg KOH/g was obtained. Subsequently, 185.9 parts (1.2 mol) of isocyanatoethyl methacrylate, 70 parts of carbitol acetate and 30 parts of solvent naphtha were introduced thereinto and the resulting mixture was heated to 50° C. and reacted for 10 hours. When it was confirmed that no isocyanate group remained therein any more, by infrared absorption spectrometry, the reaction was completed and thus an unsaturated polycarboxylic acid/urethane resin (A'-30-1) having an acid value of the solid component of 40 mg KOH/g and a solid concentration of 65% was obtained.

Synthesis Examples 27 to 29

The reaction of the Synthesis Example 26 was repeated except that the amounts of the three feed-stocks to be used in the reaction of the tetrahydrophthalic anhydride, i.e., the tetrahydrophthalic anhydride, carbitol acetate and solvent naphtha were varied. Thus unsaturated polycarboxylic acid/ urethane resins having a solid concentration of 65% as listed in Table 6 were obtained.

TABLE 6

| Synthesis Example | 27 | 28 | 29 |
|---|---|---|---|
| carbitol acetate feed | 195.6 | 242.3 | 292.1 |
| solvent naphtha feed | 83.8 | 103.8 | 125.2 |
| tetrahydrophthalic anhydride feed | 518.9 | 642.8 | 775 |
| unsaturated polycarboxylic acid/urethane resin | A'-30-2 | A'-30-3 | A'-30-4 |
| acid value of solid component (mg KOH/g) | 50 | 60 | 70 |

[Example of the synthesis of unsaturated polycarboxylic acid/urethane resin free from the component (b) (resins of Comparative Examples 7 to 11)]

Synthesis Example 30

2200 parts (10 equivalents) of a cresol novolak resin (EOCN-104S, mfd. by Nippon Kayaku K.K., softening point: 92° C., epoxy equivalent: 220), 720 parts (10 mol) of acrylic acid, 4.5 parts of methylhydroquinone, 1107 parts of carbitol acetate and 475 parts of solvent naphtha were fed into a reactor heated to 90° C. under stirring to thereby dissolve the reaction mixture. Then the reaction mixture was cooled to 60° C. and 13.5 parts of triphenylphosphine was added thereto. After heating at 100° C. and reacting for about 32 hours, a reaction product (hydroxyl group: 10 equivalents) having an acid value of 1.1 mg KOH/g was obtained. To this reaction product were added 374.4 parts (2.46 mol) of tetrahydrophthalic anhydride, 141 parts of carbitol acetate and 60.6 parts of solvent naphtha. The obtained mixture was heated to 95° C., reacted for about 6 hours and cooled. Thus an unsaturated polycarboxylic acid resin (hydroxyl group: 7.54 equivalents) having an acid value of the solid component of 41.7 mg KOH/g was obtained. Subsequently, 143 parts (0.92 mol) of isocyanatoethyl methacrylate, 53.9 parts of carbitol acetate and 23.1 parts of solvent naphtha were introduced thereinto and the resulting mixture was heated to 50° C. and reacted for 10 hours. When it was confirmed that no isocyanate group remained therein any more by infrared absorption spectrometry, the reaction was completed and thus an unsaturated polycarboxylic acid/urethane resin (A'-0-1) having an acid value of the solid component of 40 mg KOH/g and a solid concentration of 65% was obtained.

Synthesis Examples 31 to 34

The reaction of the Synthesis Example 30 was repeated except that the amounts of the three feed-stocks to be used in the reaction of the tetrahydrophthalic anhydride, i.e., the tetrahydrophthalic anhydride, carbitol acetate and solvent naphtha were varied. Thus unsaturated polycarboxylic acid/urethane resins having a solid concentration of 65% as listed in Table 7 were obtained.

TABLE 7

| Synthesis Example | 31 | 32 | 33 | 34 |
|---|---|---|---|---|
| carbitol acetate feed | 182 | 188.9 | 271.8 | 321.4 |
| solvent naphtha feed | 78 | 80.9 | 116.4 | 137.7 |
| tetrahydrophthalic anhydride feed | 482.8 | 501 | 721.0 | 852.6 |
| unsaturated polycarboxylic acid/urethane resin | A'-0-2 | A'-0-3 | A'-0-4 | A'-0-5 |
| acid value of solid component (mg KOH/g) | 50 | 60 | 70 | 80 |

Examples 1 to 23 and Comparative Examples 1 to 11

In accordance with the standard compositions as specified in the following Table 8 wherein all parts are by weight, resist ink compositions (i) and (ii) were produced by separately milling in a three-roll mill. Next, 250 g of the resist ink composition (i) and 70 g of the resist ink composition (ii) were homogeneously blended together to thereby give a resist ink composition.

TABLE 8

| Standard composition: | |
|---|---|
| (i) | part |
| unsaturated polycarboxylic acid resin (A) or unsaturated polycarboxylic acid/urethane resin (A') obtained in each Example | 154 |
| component (B): | |
| Irgacure 907 | 12 |
| Kayacure DETX-S | 0.5 |
| component (C): | |
| carbitol acetate | 5 |
| Solvesso 150 | 5 |
| Kayarad DPHA | 10 |
| miscellaneous: | |
| Fuselex | 54.7 |
| Aerosil 380 | 5 |
| phthalocyanine green (coloring pigment) | 1.8 |
| dicyandiamide (epoxy curing agent) | 1.0 |
| in total | 250. |
| (ii) | part |
| component (C): | |
| Kayarad DPHA | 10 |
| carbitol acetate | 10 |
| Solvesso 150 | 5 |
| component (D): | |
| EOCN-104S | 5 |
| Tepic | 20 |
| miscellaneous: | |
| barium sulfate | 20 |
| in total | 70. |

(Note)
Irgacure 907: mfd. by Ciba-Geigy, a photopolymerization initiator, 2-methyl-1-[4-(methylthio)phenyl]-2-morpholinopropan-1-one.

Kayacure DETX-S: mfd. by Nippon Kayaku K.K., a photopolymerization initiator, 2,4-diethylthioxanthone.
Solvesso 150: mfd. by Exxon Corp., solvent naphtha.
Kayarad DPHA: mfd. by Nippon Kayaku K.K., a mixture of dipentaerythritol hexa- and pentaacrylates.
Fuselex: mfd. by Tatsumori K.K., fused silica.
Aerosil 380: mfd. by Nippon Aerosil, anhydrous silica.
EOCN-104S: mfd. by Nippon Kayaku K.K., an o-cresol novolak epoxy resin.
Tepic: mfd. by Nissan Chemical Industries, Ltd., triglycidyl isocyanurate.

The resist ink composition thus obtained was applied onto the whole surface of a patterned copper through-hole printed circuit board by the screen printing method with the use of a 100-mesh polyester screen in such a manner as to give a thickness of 20 to 30 μm. The coating film was dried for a given period of time with a hot air dryer at 85° C. Then a negative film having a resist pattern was closely adhered to the coating film and irradiated with UV light by using an UV-exposure device (Model HMW-680GW, mfd. by Oak K.K.) at an exposure dose of 350 mJ/cm$^2$. Next, it was developed with a 1% aqueous solution of sodium carbonate for 60 seconds under a spray pressure of 2.0 kg/cm$^2$ to thereby dissolve and eliminate the unexposed part. Subsequently, it was cured by heating with a hot air dryer at 150° C. for 40 minutes to thereby give a cured article.

Corresponding to Synthesis Examples 1 to 34, resist ink compositions comprising the resins obtained in Synthesis Examples 1 to 19 were referred to respectively as samples of Examples 1 to 19 while those comprising the resins obtained in Synthesis Examples 26 to 29 were referred to respectively as samples of Examples 20 to 23. Resist ink compositions comprising the resins obtained in Synthesis Examples 20 to 25 were referred to respectively as samples of Comparative Examples 1 to 6, while those comprising the resins obtained in Synthesis Examples 30 to 34 were referred to respectively as samples of Comparative Examples 7 to 11.

[Experiments]

Among the samples obtained in the above-mentioned Examples 1 to 23 and Comparative Examples 1 to 11, developed samples before the heat curing were subjected to a test on developability, while heat-cured samples were subjected to a test on adhesion, soldering heat resistance and electroless gold plating resistance. Now procedures of these tests will be described in detail.

1. Developability

Developabilities of samples, the coating films of which had been dried for 30, 45, 60, 70, 80, 90, 100 and 110 minutes, were evaluated with the naked eye under a magnifying glass.

o: The ink was completely eliminated in the development step and development could be effected.

x: Some ink residue was observed in the development step and some part of the sample remained undeveloped.

2. Adhesion

In accordance with the rest method specified in JIS D 0202, a cured film was provided with grid sections. After effecting the peeling test with the use of an adhesive cellophane tape, the peeling conditions were evaluated with the naked eye.

⊚: 100/100, i.e., none of 100 sections peeled.

○: 100/100, though a few sections peeled.

Δ: 50/100 to 90/100, i.e., 50 to 90 sections among 100 remained unpeeled.

x: 0/100 to 50/100, i.e., 0 to 50 sections among 100 remained unpeeled.

3. Soldering heat resistance

In accordance with the test method specified in JIS C 6481, a sample coated with a flux was dipped in a bath of molten solder at 260° C. for 10 seconds each time and the change in appearance thus caused was evaluated. When a post flux was used as the flux (X), dipping was repeated thrice before evaluation. When a leveler flux was used (Y), dipping was repeated and then the sample was dipped in boiling water for 10 minutes before evaluation. The flux was applied before each dipping in the soldering bath. As the post flux, a rosin-based flux specified in JIS C 6481 was used, while W-121 (mfd. by Mekku K.K.) was used as the leveler flux.

The soldering heat resistance was evaluated on the basis of the following criteria.

○: No change in appearance.

Δ: A color change in the cured film was observed.

x: The cured film underwent lifting, peeling and solder crawling.

4. Electroless gold plating resistance

The copper plane of a patterned copper through-hole printed circuit board was surface-treated by jet-scrub polishing (x) with the use of an abrasive No. 270 (mfd. by Ishii Hyoki K.K.), washing with water and drying or polishing (y) with the use of a roll buff No. 1200 (mfd. by Ishii Hyoki K.K.), washing with water and drying. The resultant board was, subjected to coating, drying, exposure, development and heating in the same manner as the one described above to thereby give a test piece. By using this test piece, electroless gold plating was effected by the method as specified below. Then the test piece was subjected to the peeling test with the use of an adhesive cellophane tape and the peeling conditions of the resist were evaluated.

○: Neither any change in appearance nor resist peeling was observed.

Δ: No change in appearance was observed, though slight peeling of the resist was observed.

x: The resist suffered from lifting and plate crawling, and significant peeling was observed in the peeling test.

Method for electroless gold plating:

The test piece was degreased by dipping in an acidic degreasing solution (a 20% by vol. solution of Metex L-5B mfd. by Japan MacDermid) at 30° C. for 3 minutes and then washed with water by dipping in running water for 3 minutes. Next, the test piece was subjected to soft etching by dipping in a 14.3 % by wt. aqueous solution of ammonium persulfate at room temperature for 3 minutes and then washed with water by dipping in running water for 3 minutes. After dipping in a 10% by vol. aqueous solution of sulfuric acid for 1 minute at room temperature, the test piece was washed with water by dipping in running water for 30 seconds to 1 minute. Then it was dipped in a catalyst solution (a 10% by vol. aqueous solution of Metal Plate Activator 350 mfd. by Meltex Inc.) at 30° C. for 7 minutes to thereby add the catalyst thereto and then washed with water by dipping in running water for 3 minutes. This test piece having the catalyst added thereto was subjected to electroless nickel plating by dipping in a nickel plating solution (a 20% by vol. aqueous solution of Melplate Ni-865M, mfd. by Meltex Inc. pH 4.6) at 85° C. for 20 minutes. After dipping in a 10% by vol. aqueous solution of sulfuric acid at room temperature for 1 minute, the test piece was washed with water by dipping in running water for 30 seconds to 1 minutes. Next, the test piece was subjected to electroless gold plating by dipping in a gold plating solution (an aqueous solution of 15% by vol. of Aurolectroless, mfd. by Meltex Inc. and 3% by vol. of gold potassium cyanide, pH 6) at 95° C. for 10 minutes. Then it was washed with water by dipping in running water for 3 minutes and with hot water by dipping in hot water at 60° C. for 3 minutes. After sufficient washing with water and thorough draining, an electroless gold plated test piece was obtained.

Table 9 summarizes the results of the evaluation of developability, Table 10 summarizes the results of the evaluation of adhesiveness, Table 11 summarizes the results of the evaluation of soldering heat resistance and Table 12 summarizes the results of the evaluation of electroless gold plating resistance, each tested in the above-mentioned manner.

TABLE 9

(Results of evaluation of developability)

| | Resin obtained in Synth. Ex. and acid value (mg KOH/g) of its solid component | | Drying time (min.) at 85° C. | | | | | | |
|---|---|---|---|---|---|---|---|---|---|
| | | | 30 | 45 | 60 | 70 | 80 | 90 | 100 |
| Ex. 1 | unsatd. polycarboxylic acid resin (A-10-1) | acid value of solid component 40 | ○ | x | | | | | |
| Ex. 2 | unsatd. polycarboxylic acid resin (A-10-2) | acid value of solid component 50 | ○ | x | | | | | |
| Ex. 3 | unsatd. polycarboxylic acid resin (A-10-3) | acid value of solid component 60 | ○ | ○ | x | | | | |
| Ex. 4 | unsatd. polycarboxylic acid resin (A-10-4) | acid value of solid component 70 | ○ | ○ | ○ | x | | | |
| Ex. 5 | unsatd. polycarboxylic acid resin (A-20-1) | acid value of solid component 30 | ○ | x | | | | | |
| Ex. 6 | unsatd. polycarboxylic acid resin (A-20-3) | acid value of solid component 40 | ○ | ○ | x | | | | |
| Ex. 7 | unsatd. polycarboxylic acid resin (A-20-3) | acid value of solid component 50 | ○ | ○ | ○ | x | | | |
| Ex. 8 | unsatd. polycarboxylic acid resin (A-20-4) | acid value of solid component 61 | ○ | ○ | ○ | ○ | x | | |
| Ex. 9 | unsatd. polycarboxylic acid resin (A-20-5) | acid value of solid component 70 | ○ | ○ | ○ | ○ | x | | |
| Ex. 10 | unsatd. polycarboxylic acid resin (A-30-1) | acid value of solid component 30 | ○ | x | | | | | |
| Ex. 11 | unsatd. polycarboxylic acid resin (A-30-2) | acid value of solid component 40 | ○ | ○ | ○ | x | | | |
| Ex. 12 | unsatd. polycarboxylic | acid value of solid | ○ | ○ | ○ | ○ | x | | |

TABLE 9-continued (Results of evaluation of developability)

| | Resin obtained in Synth. Ex. and acid value (mg KOH/g) of its solid component | | Drying time (min.) at 85° C. | | | | | | |
|---|---|---|---|---|---|---|---|---|---|
| | | | 30 | 45 | 60 | 70 | 80 | 90 | 100 |
| | acid resin (A-30-3) | component 50 | | | | | | | |
| Ex. 13 | unsatd. polycarboxylic acid resin (A-30-4) | acid value of solid component 60 | o | o | o | o | o | o | x |
| Ex. 14 | unsatd. polycarboxylic acid resin (A-30-5) | acid value of solid component 70 | o | o | o | o | x | | |
| Ex. 15 | unsatd. polycarboxylic acid resin (A-20-1S) | acid value of solid component 30 | o | x | | | | | |
| Ex. 16 | unsatd. polycarboxylic acid resin (A-20-2S) | acid value of solid component 40 | o | o | x | | | | |
| Ex. 17 | unsatd. polycarboxylic acid resin (A-20-3S) | acid value of solid component 50 | o | o | o | x | | | |
| Ex. 18 | unsatd. polycarboxylic acid resin (A-20-4S) | acid value of solid component 65 | o | o | o | o | o | o | x |
| Ex. 19 | unsatd. polycarboxylic acid resin (A-20-5S) | acid value of solid component 70 | o | o | o | o | o | o | x |
| Ex. 20 | unsatd. polycarboxylic acid/urethane resin (A'-30-1) | acid value of solid component 40 | o | x | | | | | |
| Ex. 21 | unsatd. polycarboxylic acid/urethane resin (A'-30-2) | acid value of solid component 50 | o | x | | | | | |
| Ex. 22 | unsatd. polycarboxylic acid/urethane resin (A'-30-3) | acid value of solid component 60 | o | o | x | | | | |
| Ex. 23 | unsatd. polycarboxylic acid/urethane resin (A'-30-4) | acid value of solid component 70 | o | o | o | x | | | |
| Comp. Ex. 1 | unsatd. polycarboxylic acid resin (A-0-1) | acid value of solid component 40 | x | x | | | | | |
| Comp. Ex. 2 | unsatd. polycarboxylic acid resin (A-0-2) | acid value of solid component 50 | x | x | | | | | |
| Comp. Ex. 3 | unsatd. polycarboxylic acid resin (A-0-3) | acid value of solid component 60 | o | x | | | | | |
| Comp. Ex. 4 | unsatd. polycarboxylic acid resin (A-0-4) | acid value of solid component 70 | o | x | x | | | | |
| Comp. Ex. 5 | unsatd. polycarboxylic acid resin (A-0-5) | acid value of solid component 80 | o | o | x | | | | |
| Comp. Ex. 6 | unsatd. polycarboxylic acid resin (A-0-6) | acid value of solid component 90 | o | o | o | x | | | |
| Comp. Ex. 7 | unsatd. polycarboxylic acid/urethane resin (A'-0-1) | acid value of solid component 40 | x | x | | | | | |
| Comp. Ex. 8 | unsatd. polycarboxylic acid/urethane resin (A'-0-2) | acid value of solid component 50 | x | x | | | | | |
| Comp. Ex. 9 | unsatd. polycarboxylic acid/urethane resin (A'-0-3) | acid value of solid component 60 | o | x | | | | | |
| Comp. Ex. 10 | unsatd. polycarboxylic acid/urethane resin (A'-0-4) | acid value of solid component 70 | o | x | | | | | |
| Comp. Ex. 11 | unsatd. polycarboxylic acid/urethane resin (A'-0-5) | acid value of solid component 80 | o | o | x | | | | |

TABLE 10

(Results of evaluation of adhesiveness)

| | Resin obtained in Synth. Ex. and acid value (mg KOH/g) of its solid component | | Drying time (min.) at 85° C. | | | | | | |
|---|---|---|---|---|---|---|---|---|---|
| | | | 30 | 45 | 60 | 70 | 80 | 90 | 100 |
| Ex. 1 | unsatd. polycarboxylic acid resin (A-10-1) | acid value of solid component 40 | ⊙ | | | | | | |
| Ex. 2 | unsatd. polycarboxylic acid resin (A-10-2) | acid value of solid component 50 | ⊙ | | | | | | |
| Ex. 3 | unsatd. polycarboxylic acid resin (A-10-3) | acid value of solid component 60 | ⊙ | ⊙ | | | | | |

TABLE 10-continued (Results of evaluation of adhesiveness)

| | Resin obtained in Synth. Ex. and acid value (mg KOH/g) of its solid component | | \multicolumn{7}{c}{Drying time (min.) at 85° C.} | | | | | | |
|---|---|---|---|---|---|---|---|---|---|
| | | | 30 | 45 | 60 | 70 | 80 | 90 | 100 |
| Ex. 4 | unsatd. polycarboxylic acid resin (A-10-4) | acid value of solid component 70 | ⊙ | ⊙ | ⊙ | | | | |
| Ex. 5 | unsatd. polycarboxylic acid resin (A-20-1) | acid value of solid component 30 | ⊙ | | | | | | |
| Ex. 6 | unsatd. polycarboxylic acid resin (A-20-2) | acid value of solid component 40 | ⊙ | ⊙ | | | | | |
| Ex. 7 | unsatd. polycarboxylic acid resin (A-20-3) | acid value of solid component 50 | ⊙ | ⊙ | ⊙ | | | | |
| Ex. 8 | unsatd. polycarboxylic acid resin (A-20-4) | acid value of solid component 61 | ⊙ | ⊙ | ⊙ | ⊙ | | | |
| Ex. 9 | unsatd. polycarboxylic acid resin (A-20-5) | acid value of solid component 70 | ⊙ | ⊙ | ⊙ | ⊙ | | | |
| Ex. 10 | unsatd. polycarboxylic acid resin (A-30-1) | acid value of solid component 30 | ⊙ | | | | | | |
| Ex. 11 | unsatd. polycarboxylic acid resin (A-30-2) | acid value of solid component 40 | ⊙ | ⊙ | ⊙ | | | | |
| Ex. 12 | unsatd. polycarboxylic acid resin (A-30-3) | acid value of solid component 50 | ⊙ | ⊙ | ⊙ | ⊙ | | | |
| Ex. 13 | unsatd. polycarboxylic acid resin (A-30-4) | acid value of solid component 60 | ⊙ | ⊙ | ⊙ | ⊙ | ⊙ | ⊙ | |
| Ex. 14 | unsatd. polycarboxylic acid resin (A-30-5) | acid value of solid component 70 | ⊙ | ⊙ | ⊙ | ⊙ | | | |
| Ex. 15 | unsatd. polycarboxylic acid resin (A-20-1S) | acid value of solid component 30 | ⊙ | | | | | | |
| Ex. 16 | unsatd. polycarboxylic acid resin (A-20-2S) | acid value of solid component 40 | ⊙ | ⊙ | | | | | |
| Ex. 17 | unsatd. polycarboxylic acid resin (A-20-3S) | acid value of solid component 50 | ⊙ | ⊙ | ⊙ | | | | |
| Ex. 18 | unsatd. polycarboxylic acid resin (A-20-4S) | acid value of solid component 65 | ⊙ | ⊙ | ⊙ | ⊙ | ⊙ | ⊙ | |
| Ex. 19 | unsatd. polycarboxylic acid resin (A-20-5S) | acid value of solid component 70 | ⊙ | ⊙ | ⊙ | ⊙ | ⊙ | ⊙ | |
| Ex. 20 | unsatd. polycarboxylic acid/urethane resin (A'-30-1) | acid value of solid component 40 | ⊙ | | | | | | |
| Ex. 21 | unsatd. polycarboxylic acid/urethane resin (A'-30-2) | acid value of solid component 50 | ⊙ | | | | | | |
| Ex. 22 | unsatd. polycarboxylic acid/urethane resin (A'-30-3) | acid value of solid component 60 | ⊙ | ⊙ | | | | | |
| Ex. 23 | unsatd. polycarboxylic acid/urethane resin (A'-30-4) | acid value of solid component 70 | ⊙ | ⊙ | ⊙ | | | | |
| Comp. Ex. 1 | unsatd. polycarboxylic acid resin (A-0-4) | acid value of solid component 40 | \multicolumn{7}{l}{Not evaluated since development was impossible.} | | | | | | |
| Comp. Ex. 2 | unsatd. polycarboxylic acid resin (A-0-4) | acid value of solid component 50 | | | | | | | |
| Comp. Ex. 3 | unsatd. polycarboxylic acid resin (A-0-4) | acid value of solid component 60 | ⊙ | | | | | | |
| Comp. Ex. 4 | unsatd. polycarboxylic acid resin (A-0-4) | acid value of solid component 70 | ⊙ | | | | | | |
| Comp. Ex. 5 | unsatd. polycarboxylic acid resin (A-0-5) | acid value of solid component 80 | ⊙ | ⊙ | | | | | |
| Comp. Ex. 6 | unsatd. polycarboxylic acid resin (A-0-6) | acid value of solid component 90 | ⊙ | ⊙ | ⊙ | | | | |
| Comp. Ex. 7 | unsatd. polycarboxylic acid/urethane resin (A'-0-1) | acid value of solid component 40 | \multicolumn{7}{l}{Not evaluated since development was impossible.} | | | | | | |
| Comp. Ex. 8 | unsatd. polycarboxylic acid/urethane resin (A'-0-2) | acid value of solid component 50 | | | | | | | |
| Comp. Ex. 9 | unsatd. polycarboxylic acid/urethane resin (A'-0-3) | acid value of solid component 60 | ⊙ | | | | | | |
| Comp. Ex. 10 | unsatd. polycarboxylic acid/urethane resin (A'-0-4) | acid value of solid component 70 | ⊙ | | | | | | |
| Comp. Ex. 11 | unsatd. polycarboxylic acid/urethane resin (A'-0-5) | acid value of solid component 80 | ⊙ | ⊙ | | | | | |

TABLE 11

(Results of evaluation of soldering resistance)

| Resin obtained in Synth. Ex. and acid value (mg KOH/g) of its solid component | | Drying time (min.) at 85° C. | | | | | | | | | | | | |
|---|---|---|---|---|---|---|---|---|---|---|---|---|---|---|
| | | 30 | | 45 | | 60 | | 70 | | 80 | | 90 | | 100 |
| | | X | Y | X | Y | X | Y | X | Y | X | Y | X | Y | X | Y |
| Ex. 1 | unsatd. polycarboxylic acid resin (A-10-1) acid value of solid component 40 | ○ | ○ | | | | | | | | | | | | |
| Ex. 2 | unsatd. polycarboxylic acid resin (A-10-2) acid value of solid component 50 | ○ | ○ | | | | | | | | | | | | |
| Ex. 3 | unsatd. polycarboxylic acid resin (A-10-3) acid value of solid component 60 | ○ | ○ | ○ | ○ | | | | | | | | | | |
| Ex. 4 | unsatd. polycarboxylic acid resin (A-10-4) acid value of solid component 70 | ○ | ○ | ○ | ○ | ○ | ○ | | | | | | | | |
| Ex. 5 | unsatd. polycarboxylic acid resin (A-20-1) acid value of solid component 30 | ○ | ○ | | | | | | | | | | | | |
| Ex. 6 | unsatd. polycarboxylic acid resin (A-20-2) acid value of solid component 40 | ○ | ○ | ○ | ○ | | | | | | | | | | |
| Ex. 7 | unsatd. polycarboxylic acid resin (A-20-3) acid value of solid component 50 | ○ | ○ | ○ | ○ | ○ | ○ | | | | | | | | |
| Ex. 8 | unsatd. polycarboxylic acid resin (A-20-4) acid value of solid component 61 | ○ | ○ | ○ | ○ | ○ | ○ | ○ | ○ | | | | | | |
| Ex. 9 | unsatd. polycarboxylic acid resin (A-20-5) acid value of solid component 70 | ○ | ○ | ○ | ○ | ○ | ○ | ○ | ○ | | | | | | |
| Ex. 10 | unsatd. polycarboxylic acid resin (A-30-1) acid value of solid component 30 | ○ | ○ | | | | | | | | | | | | |
| Ex. 11 | unsatd. polycarboxylic acid resin (A-30-2) acid value of solid component 40 | ○ | ○ | ○ | ○ | ○ | ○ | | | | | | | | |
| Ex. 12 | unsatd. polycarboxylic acid resin (A-30-3) acid value of solid component 50 | ○ | ○ | ○ | ○ | ○ | ○ | ○ | ○ | | | | | | |
| Ex. 13 | unsatd. polycarboxylic acid resin (A-30-4) acid value of solid component 60 | ○ | ○ | ○ | ○ | ○ | ○ | ○ | ○ | ○ | ○ | ○ | ○ | | |
| Ex. 14 | unsatd. polycarboxylic acid resin (A-30-5) acid value of solid component 70 | ○ | ○ | ○ | ○ | ○ | ○ | ○ | ○ | | | | | | |
| Ex. 15 | unsatd. polycarboxylic acid resin (A-20-1S) acid value of solid component 30 | ○ | ○ | | | | | | | | | | | | |
| Ex. 16 | unsatd. polycarboxylic acid resin (A-20-2S) acid value of solid component 40 | ○ | ○ | ○ | ○ | | | | | | | | | | |
| Ex. 17 | unsatd. polycarboxylic acid resin (A-20-3S) acid value of solid component 50 | ○ | ○ | ○ | ○ | ○ | ○ | | | | | | | | |
| Ex. 18 | unsatd. polycarboxylic acid resin (A-20-4S) acid value of solid component 65 | ○ | ○ | ○ | ○ | ○ | ○ | ○ | ○ | ○ | ○ | ○ | ○ | ○ | ○ |
| Ex. 19 | unsatd. polycarboxylic acid resin (A-20-5S) acid value of solid component 70 | ○ | ○ | ○ | ○ | ○ | ○ | ○ | ○ | ○ | ○ | ○ | ○ | ○ | ○ |
| Ex. 20 | unsatd. polycarboxylic acid/urethane resin (A'-30-1) acid value of solid component 40 | ○ | ○ | | | | | | | | | | | | |
| Ex. 21 | unsatd. polycarboxylic acid/urethane resin (A'-30-2) acid value of solid component 50 | ○ | ○ | | | | | | | | | | | | |
| Ex. 22 | unsatd. polycarboxylic acid/urethane resin (A'-30-3) acid value of solid component 60 | ○ | ○ | ○ | ○ | | | | | | | | | | |
| Ex. 23 | unsatd. polycarboxylic acid/urethane resin (A'-30-4) acid value of solid component 70 | ○ | ○ | ○ | ○ | ○ | ○ | | | | | | | | |
| Comp. Ex. 1 | unsatd. polycarboxylic acid resin (A-0-1) acid value of solid component 40 | Not evaluated since development was impossible. | | | | | | | | | | | | | |
| Comp. Ex. 2 | unsatd. polycarboxylic acid resin (A-0-2) acid value of solid component 50 | Not evaluated since development was impossible. | | | | | | | | | | | | | |
| Comp. Ex. 3 | unsatd. polycarboxylic acid resin (A-0-3) acid value of solid component 60 | ○ | ○ | | | | | | | | | | | | |
| Comp. Ex. 4 | unsatd. polycarboxylic acid resin (A-0-4) acid value of solid component 70 | ○ | ○ | | | | | | | | | | | | |
| Comp. Ex. 5 | unsatd. polycarboxylic acid resin (A-0-5) acid value of solid component 80 | ○ | ○ | ○ | ○ | | | | | | | | | | |
| Comp. Ex. 6 | unsatd. polycarboxylic acid resin (A-0-6) acid value of solid component 90 | ○ | ○ | ○ | ○ | ○ | ○ | | | | | | | | |
| Comp. Ex. 7 | unsatd. polycarboxylic acid/urethane resin (A'-0-1) acid value of solid component 40 | Not evaluated since development was impossible. | | | | | | | | | | | | | |
| Comp. Ex. 8 | unsatd. polycarboxylic acid/urethane resin (A'-0-2) acid value of solid component 50 | Not evaluated since development was impossible. | | | | | | | | | | | | | |
| Comp. Ex. 9 | unsatd. polycarboxylic acid/urethane resin (A'-0-3) acid value of solid component 60 | ○ | ○ | | | | | | | | | | | | |
| Comp. Ex. 10 | unsatd. polycarboxylic acid/urethane resin (A'-0-4) acid value of solid component 70 | ○ | ○ | | | | | | | | | | | | |
| Comp. Ex. 11 | unsatd. polycarboxylic acid/urethane resin (A'-0-5) acid value of solid component 80 | ○ | ○ | ○ | ○ | | | | | | | | | | |

Note) X stands for the results of the evaluation of post flux resistance, while Y stands for the results of the evaluation of leveler flux resistance.

TABLE 12

(Results of evaluation of gold plating resistance)

| Resin obtained in Synth. Ex. and acid value (mg KOH/g) of its solid component | | | Drying time (min.) at 85° C. | | | | | | | | | | | | |
|---|---|---|---|---|---|---|---|---|---|---|---|---|---|---|---|
| | | | 30 | | 45 | | 60 | | 70 | | 80 | | 90 | | 100 | |
| | | | x | y | x | y | x | y | x | y | x | y | x | y | x | y |
| Ex. 1 | unsatd. polycarboxylic acid resin (A-10-1) | acid value of solid component 40 | ○ | ○ | | | | | | | | | | | | |
| Ex. 2 | unsatd. polycarboxylic acid resin (A-10-2) | acid value of solid component 50 | ○ | ○ | | | | | | | | | | | | |
| Ex. 3 | unsatd. polycarboxylic acid resin (A-10-3) | acid value of solid component 60 | ○ | ○ | ○ | ○ | | | | | | | | | | |
| Ex. 4 | unsatd. polycarboxylic acid resin (A-10-4) | acid value of solid component 70 | ○ | ○ | ○ | ○ | ○ | ○ | | | | | | | | |
| Ex. 5 | unsatd. polycarboxylic acid resin (A-20-1) | acid value of solid component 30 | ○ | ○ | | | | | | | | | | | | |
| Ex. 6 | unsatd. polycarboxylic acid resin (A-20-2) | acid value of solid component 40 | ○ | ○ | ○ | ○ | | | | | | | | | | |
| Ex. 7 | unsatd. polycarboxylic acid resin (A-20-3) | acid value of solid component 50 | ○ | ○ | ○ | ○ | ○ | ○ | | | | | | | | |
| Ex. 8 | unsatd. polycarboxylic acid resin (A-20-4) | acid value of solid component 61 | ○ | ○ | ○ | ○ | ○ | ○ | ○ | ○ | | | | | | |
| Ex. 9 | unsatd. polycarboxylic acid resin (A-20-5) | acid value of solid component 70 | ○ | ○ | ○ | ○ | ○ | ○ | ○ | ○ | | | | | | |
| Ex. 10 | unsatd. polycarboxylic acid resin (A-30-1) | acid value of solid component 30 | ○ | ○ | | | | | | | | | | | | |
| Ex. 11 | unsatd. polycarboxylic acid resin (A-30-2) | acid value of solid component 40 | ○ | ○ | ○ | ○ | ○ | ○ | | | | | | | | |
| Ex. 12 | unsatd. polycarboxylic acid resin (A-30-3) | acid value of solid component 50 | ○ | ○ | ○ | ○ | ○ | ○ | ○ | ○ | | | | | | |
| Ex. 13 | unsatd. polycarboxylic acid resin (A-30-4) | acid value of solid component 60 | ○ | ○ | ○ | ○ | ○ | ○ | ○ | ○ | ○ | ○ | ○ | ○ | ○ | ○ |
| Ex. 14 | unsatd. polycarboxylic acid resin (A-30-5) | acid value of solid component 70 | ○ | ○ | ○ | ○ | ○ | ○ | ○ | ○ | | | | | | |
| Ex. 15 | unsatd. polycarboxylic acid resin (A-20-1S) | acid value of solid component 30 | ○ | ○ | | | | | | | | | | | | |
| Ex. 16 | unsatd. polycarboxylic acid resin (A-20-2S) | acid value of solid component 40 | ○ | ○ | ○ | ○ | | | | | | | | | | |
| Ex. 17 | unsatd. polycarboxylic acid resin (A-20-3S) | acid value of solid component 50 | ○ | ○ | ○ | ○ | ○ | ○ | | | | | | | | |
| Ex. 18 | unsatd. polycarboxylic acid resin (A-20-4S) | acid value of solid component 65 | ○ | ○ | ○ | ○ | ○ | ○ | ○ | ○ | ○ | ○ | ○ | ○ | | |
| Ex. 19 | unsatd. polycarboxylic acid resin (A-20-5S) | acid value of solid component 70 | ○ | ○ | ○ | ○ | ○ | ○ | ○ | ○ | ○ | ○ | ○ | ○ | | |
| Ex. 20 | unsatd. polycarboxylic acid/urethane resin (A'-30-1) | acid value of solid component 40 | ○ | ○ | | | | | | | | | | | | |
| Ex. 21 | unsatd. polycarboxylic acid/urethane resin (A'-30-2) | acid value of solid component 50 | ○ | ○ | | | | | | | | | | | | |
| Ex. 22 | unsatd. polycarboxylic acid/urethane resin (A'-30-3) | acid value of solid component 60 | ○ | ○ | ○ | ○ | | | | | | | | | | |
| Ex. 23 | unsatd. polycarboxylic acid/urethane resin (A'-30-4) | acid value of solid component 70 | ○ | ○ | ○ | ○ | ○ | ○ | | | | | | | | |
| Comp. Ex. 1 | unsatd. polycarboxylic acid resin (A-0-1) | acid value of solid component 40 | Not evaluated since development was impossible. | | | | | | | | | | | | | |
| Comp. Ex. 2 | unsatd. polycarboxylic acid resin (A-0-2) | acid value of solid component 50 | Not evaluated since development was impossible. | | | | | | | | | | | | | |
| Comp. Ex. 3 | unsatd. polycarboxylic acid resin (A-0-3) | acid value of solid component 60 | Δ | ○ | | | | | | | | | | | | |
| Comp. Ex. 4 | unsatd. polycarboxylic acid resin (A-0-4) | acid value of solid component 70 | Δ | ○ | | | | | | | | | | | | |
| Comp. Ex. 5 | unsatd. polycarboxylic acid resin (A-0-5) | acid value of solid component 80 | x | Δ | x | Δ | | | | | | | | | | |
| Comp. Ex. 6 | unsatd. polycarboxylic acid resin (A-0-6) | acid value of solid component 90 | x | Δ | x | Δ | x | Δ | | | | | | | | |
| Comp. Ex. 7 | unsatd. polycarboxylic acid/urethane resin (A'-0-1) | acid value of solid component 40 | Not evaluated since development was impossible. | | | | | | | | | | | | | |
| Comp. Ex. 8 | unsatd. polycarboxylic acid/urethane resin (A'-0-2) | acid value of solid component 50 | Not evaluated since development was impossible. | | | | | | | | | | | | | |
| Comp. | unsatd. polycarboxylic | acid value of solid | Δ | ○ | | | | | | | | | | | | |

TABLE 12-continued (Results of evaluation of gold plating resistance)

| Resin obtained in | | Drying time (min.) at 85° C. | | | | | | | | | | | | |
|---|---|---|---|---|---|---|---|---|---|---|---|---|---|---|
| Synth. Ex. and acid value | | 30 | | 45 | | 60 | | 70 | | 80 | | 90 | | 100 |
| (mg KOH/g) of its solid component | | x | y | x | y | x | y | x | y | x | y | x | y | x | y |
| Ex. 9 acid/urethane resin (A'-0-3) | component 60 | | | | | | | | | | | | | |
| Comp. unsatd. polycarboxylic | acid value of solid | Δ | ○ | | | | | | | | | | | |
| Ex. 10 acid/urethane resin (A'-0-4) | component 70 | | | | | | | | | | | | | |
| Comp. unsatd. polycarboxylic | acid value of solid | x | Δ | x | Δ | ○ | ○ | | | | | | | |
| Ex. 11 acid/urethane resin (A'-0-5) | component 80 | | | | | | | | | | | | | |

Note) x stands for the results of the evaluation of a test piece the copper plane of which had been jet-scrab polished with an abrasive No. 270, while y stands for the results of the evaluation of a test piece the copper plane of which had been buff polished with a roll buff No. 1200.

As the results given in Tables 9 to 12 clearly show, the resist ink composition of the present invention and cured article prepared therefrom are excellent in developability with a dilute aqueous alkali solution even though the resin serving as the main component has a small acid value (mg KOH/g) and can be developed even though the drying time is prolonged. Further, the cured article is excellent in electroless gold plating resistance.

In the formation of a solder resist pattern via selective UV-exposure through a patterned film followed by development of the unexposed part, the resist ink composition of the present invention is excellent in developability even though at a small acid value (mg KOH/g) or over a prolonged drying time and shows a resistance of the exposed part against the developing solution. Further, a cured article prepared therefrom is excellent in electroless gold plating resistance and fully satisfactory in adhesiveness and soldering heat resistance. Thus it is suitable, in particular, as a liquid solder resist ink composition.

We claim:

1. A resist ink composition comprising an unsaturated polycarboxylic acid resin (A), a photopolymerization initiator (B), a diluent (C), and a curing component (D), wherein said unsaturated polycarboxylic acid resin (A) comprises a product of reaction between a reaction product (I) and a polybasic acid (d), said reaction product (I) being one formed by the reaction of the following components (a), (b) and (c):

(a) an epoxy compound having at least two epoxy groups in its molecule, (b) a compound having at least two hydroxyl groups and a non-hydroxylic reactive group that reacts with an epoxy group, and (c) an unsaturated monocarboxylic acid.

2. A resist ink composition claimed in claim 1 wherein the acid value of said unsaturated polycarboxylic acid resin (A) is from 30 to 100 mg KOH/g, the total amount of said compound (b) and said unsaturated monocarboxylic acid (c) is from 0.8 to 1.3 mol per equivalent of the epoxy group in said epoxy compound (a), and the amount of said compound (b) is from 0.05 to 0.5 mol per mol of the total amount of said compound (b) and said unsaturated monocarboxylic acid (c).

3. A resist ink composition claimed in claim 1 wherein said epoxy compound (a) is a novolak epoxy resin, said compound (b) is a ($C_1$ to $C_8$) monocarboxylic acid having two or more hydroxyl groups or a di ($C_1$ to $C_5$) alkanolamine, said unsaturated monocarboxylic acid (c) is acrylic acid or its derivative, and said polybasic acid (d) is an anhydride of a carboxylic acid having 2 to 4 carboxyl groups in its molecule and used in a proportion of from 0.1 to 0.9 equivalent per equivalent of the hydroxyl groups in the reaction product (I).

4. A resist ink composition claimed in claim 3 wherein said epoxy compound (a) is a phenol novolak epoxy resin or a cresol novolak epoxy resin, said compound (b) is dimethylolpropionic acid, said unsaturated monocarboxylic acid (c) is acrylic acid, and said polybasic acid (d) is tetrahydrophthalic anhydride or succinic anhydride.

5. A cured article prepared from a resist ink composition claimed in any of claims 1 through 4, which is formed by the steps of: applying a resist ink composition claimed in any of claims 1 through 4 onto a substrate to form a coating film; drying and then exposing the coating film through a film having a resist pattern; developing the coating film; and curing by heating or UV-irradiation.

6. A resist ink composition comprising an unsaturated polycarboxylic acid/urethane resin (A'), a photopolymerization initiator (S), a diluent (C), and a curing component (D), wherein said unsaturated polycarboxylic acid/urethane resin (A') comprises a product of reaction among a reaction product (I), a polybasic acid (d) and an unsaturated monoisocyanate (e), said reaction product (I) being one formed by the reaction of the following components (a), (b) and (c):

(a) an epoxy compound having at least two epoxy groups in its molecule, (b) a compound having at least two hydroxyl groups and a non-hydroxylic reactive group that reacts with an epoxy group, and (c) an unsaturated monocarboxylic acid.

7. A resist ink composition claimed in claim 6 wherein the acid value of said unsaturated polycarboxylic acid/urethane resin (A') is from 30 to 100 mg KOH/g, the total amount of said compound (b) and said unsaturated monocarboxylic acid (c) is from 0.8 to 1.3 mol per equivalent of the epoxy groups in said epoxy compound (a), and the amount of said compound (b) is from 0.05 to 0.5 mol per mol of the total amount of said compound (b) and said unsaturated monocarboxylic acid (c).

8. A resist ink composition claimed in claim 6 wherein said epoxy compound (a) is a novolak epoxy resin, said compound (b) is a ($C_1$ to $C_8$) monocarboxylic acid having two or more hydroxyl groups or a di($C_1$ to $C_5$) alkanolamine, said unsaturated monocarboxylic acid (c) is acrylic acid or its derivative, said polybasic acid (d) is an anhydride of a carboxylic acid having 2 to 4 carboxyl groups in its molecule and used in a proportion of from 0.1 to 0.9 equivalent per equivalent of the hydroxyl groups in the reaction product (I), and said unsaturated monoisocyanate (e) is a monoisocyanate of (meth)acrylic acid or a ($C_1$–$C_5$) alkyl ester thereof or a product of reaction between an organic diisocyanate and a (meth)acrylate having a hydroxyl group in its molecule and used in a proportion of from 0.05 to 0.5 equivalent per equivalent of the hydroxyl groups in the unsaturated polycarboxylic acid resin (A).

9. A cured article prepared from a resist ink composition claimed in any of claims 6 through 8, which is formed by the steps of: applying a resist ink composition claimed in any of claims 6 through 8 onto a substrate to form a coating film; drying and then exposing the coating film through a film having a resist pattern; developing the coating film; and curing by heating or UV-irradiation.

* * * * *